US006828847B1

(12) United States Patent
Marinca

(10) Patent No.: US 6,828,847 B1
(45) Date of Patent: Dec. 7, 2004

(54) BANDGAP VOLTAGE REFERENCE CIRCUIT AND METHOD FOR PRODUCING A TEMPERATURE CURVATURE CORRECTED VOLTAGE REFERENCE

(75) Inventor: Stefan Marinca, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/375,593

(22) Filed: Feb. 27, 2003

(51) Int. Cl.$^{7}$ ................................................ H01L 35/00
(52) U.S. Cl. ........................ 327/513; 327/539; 323/316
(58) Field of Search ................................ 323/314, 315, 323/313, 907, 316; 327/538, 539, 540, 512, 513

(56) References Cited

U.S. PATENT DOCUMENTS

| | | | | |
|---|---|---|---|---|
| 4,603,291 A | | 7/1986 | Nelson | |
| 4,808,908 A | | 2/1989 | Lewis et al. | |
| 4,939,442 A | | 7/1990 | Carvajal et al. | |
| 5,053,640 A | | 10/1991 | Yum | |
| 5,325,045 A | | 6/1994 | Sundby | |
| 5,352,973 A | | 10/1994 | Audy | |
| 5,424,628 A | | 6/1995 | Nguyen | |
| 5,512,817 A | | 4/1996 | Nagaraj | |
| 5,933,045 A | * | 8/1999 | Audy et al. | 327/513 |
| 5,982,201 A | | 11/1999 | Brokaw et al. | |
| 6,157,245 A | | 12/2000 | Rincon-Mora | |
| 6,218,822 B1 | | 4/2001 | MacQuigg | |
| 6,329,868 B1 | | 12/2001 | Furman | |

* cited by examiner

*Primary Examiner*—Shawn Riley
(74) *Attorney, Agent, or Firm*—Wolf, Greenfield & Sacks, P.C.

(57) ABSTRACT

A bandgap voltage reference circuit (1) comprises a bandgap cell (7) comprising first and second transistor stacks (8,9) of first transistors (Q1,Q2) and second transistors (Q3,Q4), respectively, arranged for developing a correcting PTAT voltage ($\Delta V_{be}$) across a primary resistor (R1) proportional to the difference in the base-emitter voltages of the first and second transistor stacks (8,9). A first current mirror circuit (10) provides PTAT currents (12 to 15) to the emitters of the first and second transistors (Q1 to Q4), and an operational amplifier (A1) maintains the voltage on the emitter of the first transistor (Q2) of the first transistor stack (8) at the same level as the resistor (R1) and sinks a PTAT current from the first current mirror circuit (10) from which the other PTAT currents are mirrored. The correcting PTAT voltage ($\Delta V_{be}$) developed across the primary resistor (R1) is scaled onto a secondary resistor (R3) and summed with the uncorrected base-emitter CTAT voltage of the first transistor (Q1) of the first transistor stack (8) for providing the voltage reference between an output terminal (5) and ground (3). A CTAT correcting current ($I_{cr}$) is summed with the PTAT current (13) and applied to the emitter of the second transistor (Q3) of the second transistor stack (9) so that the correcting PTAT voltage ($\Delta V_{be}$) developed across the primary resistor (R1) has a TlnT curvature complementary to the TlnT temperature curvature of the uncorrected base-emitter CTAT voltage of the first transistor (Q1). Thus the reference voltage developed between the output terminal (5) and the ground (3) is temperature stable and TlnT temperature curvature corrected. The CTAT correcting current is derived from the base-emitter CTAT voltage of the first transistor (Q1) in a CTAT current generating circuit (12) through a second current mirror circuit (15).

39 Claims, 4 Drawing Sheets

BANDGAP VOLTAGE REFERENCE CIRCUIT AND METHOD FOR PRODUCING A TEMPERATURE CURVATURE CORRECTED VOLTAGE REFERENCE

FIELD OF THE INVENTION

The present invention relates to a bandgap voltage reference circuit for producing a stable TlnT temperature curvature corrected voltage reference, which preferably is suitable for fabrication in a CMOS process, and the invention also relates to a PTAT voltage generating circuit for generating a PTAT voltage with a temperature curvature complementary to an uncorrected TlnT temperature curvature CTAT voltage of the type developed across a base-emitter of a transistor, which preferably is suitable for fabrication in a CMOS process. The invention also relates to a method for producing such a voltage reference and a PTAT voltage.

BACKGROUND TO THE INVENTION

Most electronic circuits require a stable DC voltage reference, and in particular, a temperature stable DC voltage reference. Bandgap voltage reference circuits for producing a reasonably temperature stable DC voltage reference are known. Such bandgap voltage reference circuits rely on the property of a bipolar transistor to produce a substantially constant base-emitter voltage, and when fabricated in silicon, rely on the property of silicon which when a bipolar transistor is fabricated in silicon produces a base-emitter voltage in the range of 0.5 volts to 0.8 volts. However, the voltage produced by the base-emitter of a transistor has a negative temperature coefficient, in other words, the voltage is complementary to absolute temperature (CTAT). In known bandgap voltage reference circuits a pair of transistors are operated at different current densities and are arranged to develop a voltage which is proportional to the difference in the base-emitter voltages of the two transistors. This difference voltage has a positive temperature coefficient, in other words, the voltage is proportional to absolute temperature (PTAT). The PTAT voltage provided by the difference in the base-emitter voltages is properly scaled and summed with the CTAT voltage of one of the transistors to produce the voltage reference. However, as well as the linear relationship with temperature of the CTAT base-emitter voltage of a transistor, the CTAT base-emitter voltage also exhibits a non-linear temperature relationship which is referred to as temperature curvature. This non-linear relationship of the CTAT voltage to temperature is commonly represented by the term K.TlnT where K is a constant and T is absolute temperature in degrees Kelvin (° K). Thus, in order to produce a voltage reference which is entirely temperature stable over a reasonable temperature range, the TlnT temperature curvature of the CTAT base-emitter voltage must also be corrected for.

Various attempts have been made to correct for the TlnT non-linearity of the CTAT voltage of the base-emitter of a transistor. U.S. Pat. No. 5,352,973 of Audy discloses a bandgap voltage reference circuit where the TlnT temperature curvature is corrected for. The bandgap voltage reference circuit of Audy comprises a Brokaw bandgap voltage reference cell and a correction cell. The Brokaw cell comprises first and second bipolar transistors which are arranged to develop a PTAT voltage proportional to the difference in the base-emitter voltages of the two transistors. The PTAT voltage difference is developed across a first resistor. The first and second transistors are operated with PTAT collector currents, and the collectors of the two transistors are held at a common voltage by an operational amplifier.

The correcting cell corrects for the TlnT curvature term, and comprises a third bipolar transistor which co-operates with one of the second transistor of the bandgap cell for developing a voltage across a second resistor which is proportional to the difference in the base-emitter voltages of the third transistor and the second transistor of the Brokaw cell. An operational amplifier drives the emitter of the third transistor until its collector current is at a substantially constant temperature insensitive value. This, thus, causes the difference voltage developed across the second resistor to have a TlnT curvature which is complementary to the TlnT curvature of the base-emitter CTAT voltage. Currents which flow through the first resistor in the Brokaw cell and the second resistor in the correction cell are summed in a third resistor embedded in the Brokaw cell for developing a corresponding voltage with a TlnT curvature complementary to the CTAT base-emitter voltage. The voltage developed across the third resistor is summed with the CTAT base-emitter voltage of the second transistor of the bandgap cell to provide a temperature stable and TlnT curvature corrected voltage reference.

However, while the voltage reference developed by the bandgap circuit of Audy is TlnT curvature corrected, and is thus temperature stable within a relatively wide temperature range, unfortunately, the bandgap circuit of Audy does not lend itself to easy implementation in a CMOS process. Furthermore, Audy relies on the PTAT current through the first resistor and the current through the second resistor which has a TlnT curvature complementary to the CTAT base-emitter voltage for developing the PTAT voltage with TlnT curvature across the third resistor.

U.S. Pat. No. 5,424,628 of Nguyen discloses a bandgap voltage reference circuit which comprises a bandgap cell comprising a pair of bipolar transistors arranged in similar fashion to that of Audy in U.S. Pat. No. 5,352,973 for developing a PTAT voltage proportional to the difference in the base-emitter voltages of the two transistors, which is then summed with a CTAT base-emitter voltage of one of the transistors of the bandgap cell. The Nguyen bandgap voltage reference circuit includes additional circuitry for providing a correction current signal, which is generated by a current squaring circuit, and is injected into the collector of one of the two transistors of the bandgap cell such that the collectors of the two transistors have unequal current values. The correction current is injected into the transistor which is to provide the CTAT base-emitter voltage of the voltage reference, and it is alleged that the collector current difference between the two transistors enables the elimination of the TlnT curvature of the CTAT base-emitter voltage. However, the circuitry required for implementing the bandgap voltage reference circuit of Nguyen is relatively complex, and additionally, it does not lend itself to a CMOS process.

U.S. Pat. No. 6,157,245 of Rincon-Mora discloses a bandgap voltage reference circuit which comprises a bandgap cell comprising a pair of transistors arranged to develop a PTAT voltage proportional to the difference of the base-emitter voltages of the transistors, and this voltage is used to generate a PTAT current which is applied to one resistor of a resistor divider circuit comprising two resistors, across which the voltage reference is developed. The bandgap voltage reference circuit of Rincon-Mora also comprises a compensating circuit which generates a logarithmic operating temperature dependent current which is applied to the second resistor of the voltage divider network for developing a logarithmic temperature dependent correcting voltage across the second resistor. The voltages across the first and second resistors are summed to provide a voltage reference, which is allegedly temperature stable and TlnT curvature corrected. The circuitry of the Rincon-Mora bandgap voltage reference circuit is relatively complex, and does not easily lend itself to implementation in a CMOS process.

U.S. Pat. No. 5,512,817 of Nagaraj discloses a bandgap voltage reference circuit which comprises a bandgap cell comprising a pair of bipolar transistors arranged for developing a PTAT voltage proportional to the difference in the base-emitter voltages of the two transistors. The PTAT difference voltage is developed across a first resistor, and the developed PTAT difference voltage on the first resistor is scaled onto a second resistor through a current mirror circuit. The scaled voltage on the second resistor is summed with the CTAT base-emitter voltage of one of the transistors of the bandgap cell for providing the bandgap voltage reference. The voltage reference produced by this bandgap voltage reference circuit of Nagaraj does not contain any TlnT curvature correction.

U.S. Pat. No. 5,325,045 of Sundby discloses a bandgap voltage reference circuit which comprises a bandgap cell in which two stacks of bipolar transistors are arranged for developing a PTAT voltage proportional to the difference in the base-emitter voltages of the transistors of the respective stacks. The PTAT voltage difference is developed across one of three resistors of a resistor divider network. The three resistors of the resistor divider network are negative temperature coefficient resistors, and voltages developed across the other two resistors of the resistor divider network are summed with the PTAT voltage. The voltages developed across all three resistors are summed with a CTAT base-emitter voltage of a separate bipolar transistor for producing the temperature curvature corrected voltage reference. In the circuit of Sundby, the TlnT temperature curvature correction is achieved by the use of the negative temperature coefficient resistors. However, the TlnT temperature curvature compensation of the bandgap voltage reference circuit of Sundby is not particularly accurate, and use of resistors with high temperature coefficients is not desirable.

U.S. Pat. No. 5,053,640 of Yum discloses a voltage reference circuit which comprises a bandgap cell for establishing a voltage reference, and a compensation circuit for compensating for non-linear temperature dependence of the bandgap voltage reference. The bandgap cell comprises two transistors arranged for developing a correcting PTAT voltage proportional to the difference in the base-emitter voltages of the two transistors. The correcting PTAT voltage is developed across one resistor of a resistor divider network, and is summed with a compensating voltage developed across a compensation resistor in the resistor divider network. The compensation circuit comprises a switching circuit for switching a current through the compensation resistor which is varied in response to predetermined temperature threshold values for compensating for temperature curvature. However, since the compensating circuit varies the current flowing through the compensating resistor in steps in response to predetermined temperature threshold values, the temperature curvature correction provided by this circuit is relatively inaccurate, and furthermore, the circuit is a relatively complex circuit.

U.S. Pat. No. 4,939,442 of Carvajal discloses a bandgap voltage reference circuit which comprises a bandgap cell for developing a PTAT voltage proportional to the difference in base-emitter voltages of two bipolar transistors of the bandgap cell. The PTAT difference voltage is summed with CTAT base-emitter voltages of separate transistors for providing the voltage reference. However, in addition the PTAT voltage difference and the CTAT voltages of the two transistors are summed with voltages developed across two compensating resistors for compensating for the temperature curvature of the CTAT base-emitter voltages. One of the compensating resistors receives a compensating current for compensating at high temperatures, while the other compensating resistor receives a compensating current for compensating at low temperatures. A circuit for generating the high and low temperature currents is provided. However, the temperature curvature correction provided by the curvature correction circuit is of limited accuracy and does not adequately compensate for TlnT curvature. Furthermore, the circuit of Carvajal does not lend itself easily to implementation by a CMOS process.

U.S. Pat. No. 4,603,291 of Nelson discloses a bandgap voltage reference circuit which comprises a bandgap cell comprising a pair of bipolar transistors which are arranged for developing a PTAT voltage proportional to the difference in base-emitter voltages of the two transistors across a first resistor. A correction circuit generates a correction current of the form TlnT which is added to the collector of one of the transistors of the bandgap cell for eliminating the TlnT curvature from the voltage reference of the band gap cell. However, the circuitry of Nelson is relatively complex, and does not lend itself to easy implementation in a CMOS process.

U.S. Pat. No. 6,218,822 of MacQuigg discloses a bandgap voltage reference circuit which includes a bandgap cell comprising a pair of bipolar transistors arranged to develop a PTAT voltage proportional to the difference in the base-emitter voltages of the two transistors. The PTAT voltage is summed with the CTAT base-emitter voltage of one of the transistors to produce the reference voltage. Non-linear resistors, such as n-type lightly doped drain diffusion resistors, which have a curvature characteristic opposite to that of the voltage reference of the bandgap cell are provided for correcting the temperature curvature of the voltage reference. Provision is made for trimming the non-linear resistors. The temperature stability of the voltage reference of this circuit is limited, since the curvature correction is reliant solely on non-linear resistors.

U.S. Pat. No. 4,808,908 of Lewis discloses a bandgap voltage reference circuit which comprises a bandgap cell comprising a pair of bipolar transistors arranged for developing a PTAT voltage proportional to the difference in the base-emitter voltages of the two transistors. The PTAT difference voltage is summed with a CTAT base-emitter voltage of a transistor to produce the voltage reference. A compensating voltage is developed across compensating resistors is summed with the CTAT base-emitter voltage and the PTAT difference voltage for correcting for first and second derivatives of the bandgap cell output as a function of temperature. This circuit of Lewis does not easily lend itself to implementation in a CMOS process, and additionally, TlnT temperature curvature correction is limited.

There is therefore a need for a bandgap voltage reference circuit which overcomes the problems of known bandgap voltage reference circuits, and which preferably lends itself readily to implementation in a CMOS process, and provides a relatively temperature stable voltage reference which is corrected for TlnT curvature over a reasonable temperature range. There is also a need for a PTAT voltage generating circuit for generating a PTAT voltage which is complementary to a CTAT base-emitter transistor voltage, and which preferably readily lends itself to implementation in a CMOS process.

The present invention is directed towards providing such a bandgap voltage reference circuit and a PTAT voltage generating circuit, and the invention is also directed towards a method for generating such a PTAT voltage and a bandgap voltage reference.

SUMMARY OF THE INVENTION

According to the invention there is provided a bandgap voltage reference circuit for providing a temperature stable voltage reference with TlnT temperature curvature correction, the bandgap voltage reference circuit comprising at least one first transistor and at least one second transistor supplied with respective PTAT currents, the at least one second transistor being operable at a current density lower than the current density at which the at least one first transistor is operable, and co-operating with the at least one first transistor for developing a correcting PTAT voltage proportional to the difference in the base-emitter voltages of the first and second transistors for combining with an uncorrected transistor base-emitter CTAT voltage for producing the voltage reference, wherein a CTAT correcting current is supplied to one of the at least one second transistors along with the PTAT current for developing the correcting PTAT voltage with a curvature complementary to the TlnT temperature curvature of the uncorrected transistor base-emitter CTAT voltage, so that when the correcting PTAT voltage is combined with the uncorrected transistor base-emitter CTAT voltage, the voltage reference produced is temperature stable and TlnT temperature curvature corrected.

In one embodiment of the invention the ratio of the CTAT correcting current to the PTAT current is selected in response to the ratio of the area of the at least one second transistor to the area of the at least one first transistor.

Preferably, a primary resistor is provided co-operating with the first and second transistors so that the correcting PTAT voltage corresponding to the difference in the base-emitter voltages of the first and second transistors is developed across the primary resistor.

In one embodiment of the invention the at least one first transistor is connected between a first voltage level and a second voltage level, the second voltage level being different to the first voltage level, and the at least one second transistor is connected in series with the primary resistor between the first voltage level and the second voltage level.

Preferably, the PTAT current which is supplied to the second transistor to which the primary resistor is connected is supplied through the primary resistor to the second transistor.

In one embodiment of the invention the collectors of the first and second transistors are held at a common voltage level, and the PTAT currents are supplied to the emitters of the first and second transistors, the CTAT correcting current being supplied to the emitter of the second transistor, and preferably, the common voltage level is the same as the second voltage level.

In one embodiment of the invention the primary resistor is connected between the first voltage level and the emitter of one of the at least one second transistors.

In another embodiment of the invention a secondary resistor is provided, and the correcting PTAT voltage is reflected from the primary resistor across the secondary resistor, the secondary resistor co-operating with the transistor, the uncorrected base-emitter CTAT voltage of which is to be combined with the correcting PTAT voltage for summing the correcting PTAT voltage with the uncorrected base-emitter CTAT voltage of the transistor for producing the voltage reference.

Preferably, the correcting PTAT voltage is scaled from the primary resistor to the secondary resistor.

In one embodiment of the invention the transistor the uncorrected base-emitter CTAT voltage of which is to be combined with the PTAT correcting voltage is one of the at least one first transistor.

In another embodiment of the invention the CTAT correcting current is selected in response to the gain of the correcting PTAT voltage from the primary resistor to the secondary resistor.

In one embodiment of the invention the circuit comprises one first transistor and one second transistor, the bases of the first and second transistors being held at the second voltage level.

Alternatively, a plurality of first transistors are provided arranged in a first transistor stack, so that the base-emitter voltages of the first transistors are summed to provide a base-emitter voltage of the first stack, and a plurality of second transistors are arranged in a second transistor stack so that the sum of the base-emitter voltages of the second transistors are summed to provide a base-emitter voltage of the second stack, the number of second transistors in the second stack corresponding to the number of first transistors in the first stack, the first and second transistors being supplied with respective PTAT currents.

In one embodiment of the invention the base of each first transistor is connected to the emitter of the next lower first transistor in the first transistor stack, and the base of each second transistor is connected to the emitter of the next lower second transistor in the second transistor stack.

In another embodiment of the invention the primary resistor is connected between the topmost second transistor in the second transistor stack and the first voltage level.

In a further embodiment of the invention the CTAT correcting current is supplied to the lowermost second transistor of the second transistor stack.

In another embodiment of the invention the bases of the lowermost first and second transistors of the respective first and second transistor stacks are connected to the second voltage level.

In a further embodiment of the invention the transistor the uncorrected base-emitter CTAT voltage of which is to be combined with the correcting PTAT voltage is the lowermost first transistor of the first transistor stack.

Preferably, the CTAT correcting current is derived from the uncorrected base-emitter CTAT voltage of the transistor with which the correcting PTAT voltage is combined.

In one embodiment of the invention a first calibration circuit is provided for adjusting the CTAT correcting current.

In another embodiment of the invention a second calibration circuit is provided for adjusting the PTAT current supplied through the secondary resistor for adjusting the correcting PTAT voltage developed across the secondary resistor.

In a further embodiment of the invention the second calibration circuit provides for adjusting the PTAT current supplied to the transistor, the uncorrected base-emitter CTAT voltage of which is to be combined with the correcting PTAT voltage.

In one embodiment of the invention the circuit is implemented in CMOS.

Additionally, the invention provides a PTAT voltage generating circuit for generating a PTAT voltage with a curvature complementary to an uncorrected TlnT temperature curvature of a base-emitter CTAT voltage of a transistor, the PTAT voltage generating circuit comprising at least one first transistor and at least one second transistor supplied with respective PTAT currents, the at least one second transistor being operable at a current density lower than the current density at which the at least one first transistor is operable, and co-operating with the at least one first transistor for developing a PTAT voltage proportional to the difference in the base-emitter voltages of the first and second transistors, wherein a CTAT correcting current is supplied to one of the at least one second transistors along with the PTAT current for developing the PTAT voltage with the curvature complementary to the TlnT temperature curvature of an uncorrected transistor base-emitter CTAT voltage.

In one embodiment of the invention the ratio of the CTAT current to the PTAT current is selected in response to the ratio of the area of the at least one second transistor to the area of the at least one first transistor.

Preferably, a primary resistor is provided co-operating with the first and second transistors so that the PTAT voltage corresponding to the difference in the base-emitter voltages of the first and second transistors is developed across the primary resistor.

In one embodiment of the invention the at least one first transistor is connected between a first voltage level and a second voltage level, the second voltage level being different to the first voltage level, and the at least one second transistor is connected in series with the primary resistor between the first voltage level and the second voltage level.

Preferably, the PTAT current which is supplied to the second transistor to which the primary resistor is connected is supplied through the primary resistor to the second transistor.

Advantageously, the collectors of the first and second transistors are held at a common voltage level, and the PTAT currents are supplied to the emitters of the first and second transistors, the CTAT correcting current being supplied to the emitter of the second transistor. Preferably, the common voltage level is the same as the second voltage level.

In one embodiment of the invention a plurality of first transistors are provided arranged in a first transistor stack, the base of each first transistor being connected to the emitter of the next lower first transistor in the first transistor stack, so that the base-emitter voltages of the first transistors are summed to provide a base-emitter voltage of the first stack, and a plurality of second transistors arranged in a second transistor stack, the base of each second transistor being connected to the emitter of the next lower second transistor in the second transistor stack, so that the sum of the base-emitter voltages of the second transistors are summed to provide a base-emitter voltage of the second stack, the number of second transistors in the second stack corresponding to the number of first transistors in the first stack, the first and second transistors being supplied with respective PTAT currents.

In another embodiment of the invention the primary resistor is connected between the topmost second transistor in the second transistor stack and the first voltage level, and the CTAT correcting current is supplied to the lowermost second transistor of the second transistor stack, the bases of the lowermost first and second transistors of the respective first and second transistor stacks being connected to the second voltage level.

Further the invention provides a method for generating a temperature stable bandgap voltage reference with TlnT temperature curvature correction, the method comprising the steps of:

providing at least one first transistor and at least one second transistor co-operating with the at least one first transistor for developing a correcting PTAT voltage proportional to the difference in the base-emitter voltages of the first and second transistors, supplying the at least one first transistor and the at least one second transistor with respective PTAT currents, operating the at least one second transistor at a current density lower than the current density at which the at least one first transistor is being operated for developing the correcting PTAT voltage, and combining the correcting PTAT voltage with an uncorrected transistor base-emitter CTAT voltage for producing the voltage reference, wherein the method comprises the further step of supplying a CTAT correcting current to one of the at least one second transistors along with the PTAT current for developing the correcting PTAT voltage with a curvature complementary to the TlnT temperature curvature of the uncorrected transistor base-emitter CTAT voltage, so that when the correcting PTAT voltage is combined with the uncorrected transistor base-emitter CTAT voltage, the voltage reference produced is temperature stable and TlnT temperature curvature corrected.

In one embodiment of the invention the PTAT currents are supplied to the emitters of the first and second transistors and the CTAT correcting current is supplied to the emitter of the second transistor.

In another embodiment of the invention the ratio of the CTAT correcting current to the PTAT current is selected in response to the ratio of the area of the at least one first transistor to the area of the at least one second transistor.

The invention also provides a method for generating a PTAT voltage with a curvature complementary to an uncorrected TlnT temperature curvature of a base-emitter CTAT voltage of a transistor, the method comprising the steps of:

providing at least one first transistor and at least one second transistor co-operating with the at least one first transistor for developing a PTAT voltage proportional to the difference in the base-emitter voltages of the first and second transistors, supplying the at least one first transistor and the at least one second transistor with respective PTAT currents, and operating the at least one second transistor at a current density lower than the current density at which the at least one first transistor is being operated for developing the PTAT voltage proportional to the difference in the base-emitter voltages of the first and second transistors, wherein the method comprises the further step of supplying a CTAT correcting current to one of the at least one second transistors along with the PTAT current for developing the PTAT voltage with a curvature complementary to the TlnT temperature curvature of an uncorrected transistor base-emitter CTAT voltage.

In one embodiment of the invention the PTAT currents are supplied to the emitters of the first and second transistors, and the CTAT correcting current is supplied to the emitter of the second transistor.

In another embodiment of the invention the ratio of the CTAT correcting current to the PTAT current is selected in response to the ratio of the area of the at least one first transistor to the area of the at least one second transistor.

ADVANTAGES OF THE INVENTION

The advantages of the invention are many. The bandgap voltage reference provides a temperature stable voltage reference which is corrected for TlnT temperature curvature, and the voltage reference is stable over a relatively wide temperature range, and in particular over the temperature range of −40° C. to +120° C. Indeed, it is believed that the voltage reference is temperature stable over an even wider temperature range. Furthermore, the bandgap voltage reference circuit according to the invention is a relatively non-complex circuit, and can be readily easily implemented in a CMOS process with a relatively low die area requirement. This advantage has been achieved by virtue of the fact that the circuit can be constructed with the collectors of the first and second transistors tied to the same voltage level, which can be ground or any other suitable common voltage level. The PTAT voltage generated by the bandgap voltage reference circuit according to the invention as well as having a positive temperature coefficient, also has a curvature of TlnT form which is complementary to the TlnT curvature of a CTAT base-emitter voltage of a transistor, and thus, the PTAT voltage developed by the bandgap voltage reference circuit is ideally suited to correcting for the TlnT temperature curvature of the negative temperature coefficient of the base-emitter CTAT voltage of a transistor for producing a temperature stable TlnT temperature curvature corrected reference voltage. The fact that the CTAT correcting current is derived from the base-emitter CTAT voltage of one of the first transistors leads to the simplicity and temperature stability of the circuit.

The simplicity of the bandgap voltage reference circuit and the temperature stability of the voltage reference are largely achieved by virtue of the fact that correction for the transistor base-emitter CTAT voltage and the TlnT temperature curvature component of the transistor base-emitter CTAT voltage are corrected for in the same bandgap cell. In other words, both the correcting PTAT voltage and the TlnT curvature component which is complementary to the transistor base-emitter TlnT temperature curvature component are developed in the same bandgap cell. Both components of the correction voltage, in other words, the correcting PTAT voltage and the complementary TlnT temperature curvature correction are developed in the bandgap cell and are developed across the primary resistor in the bandgap cell. The correcting PTAT voltage with the complementary TlnT temperature curvature correction which are simultaneously developed across the primary resistor can then be readily reflected and if desired scaled onto the secondary resistor for summing with the uncorrected transistor base-emitter CTAT voltage.

In particular, the simplicity of the circuit according to the invention is achieved by virtue of the fact that the correcting PTAT voltage with the TlnT temperature curvature correction voltage are developed simultaneously across one single resistor, namely, the primary resistor in the bandgap cell. This leads to considerable simplification of the bandgap circuit, and furthermore, minimises the sensitivity of the bandgap circuit to process variations.

A further advantage of the invention relates to the ease with which the bandgap voltage circuit may be trimmed during calibration. Since the TlnT curvature component of the correcting PTAT voltage is developed across the primary resistor, along with the PTAT voltage, trimming of the TlnT temperature curvature component can readily easily be achieved by trimming the proportion of the CTAT correcting current which is summed with the PTAT current and supplied to the emitter of the second transistor. In other words, trimming of the TlnT curvature component is carried out by varying the ratio of the CTAT correcting current to the PTAT current supplied to the second transistor until the desired TlnT curvature component is achieved. Thus, a first calibration circuit for trimming the CTAT correcting current can readily easily be provided as a simple current DAC. This method of trimming the TlnT temperature curvature component is significantly less complex than trimming methods required in prior art bandgap voltage reference circuits. In general, in prior art bandgap voltage reference circuits, trimming of the TlnT temperature curvature requires trimming the resistors across which the TlnT temperature curvature component is developed. This requires providing a resistor network across which the TlnT temperature curvature correction voltage is developed, and provision is required for selectively switching the resistors of the resistor network into and out of the resistor network until the TlnT temperature curvature correcting voltage has been properly corrected.

The invention and its advantages will be more clearly understood from the following description of some preferred embodiments thereof, which are given by way of example only, with reference to the accompanying drawings.

DETAILED DESCRIPTION OF PREFERRED EMBODIMENTS OF THE INVENTION

Figure 1:
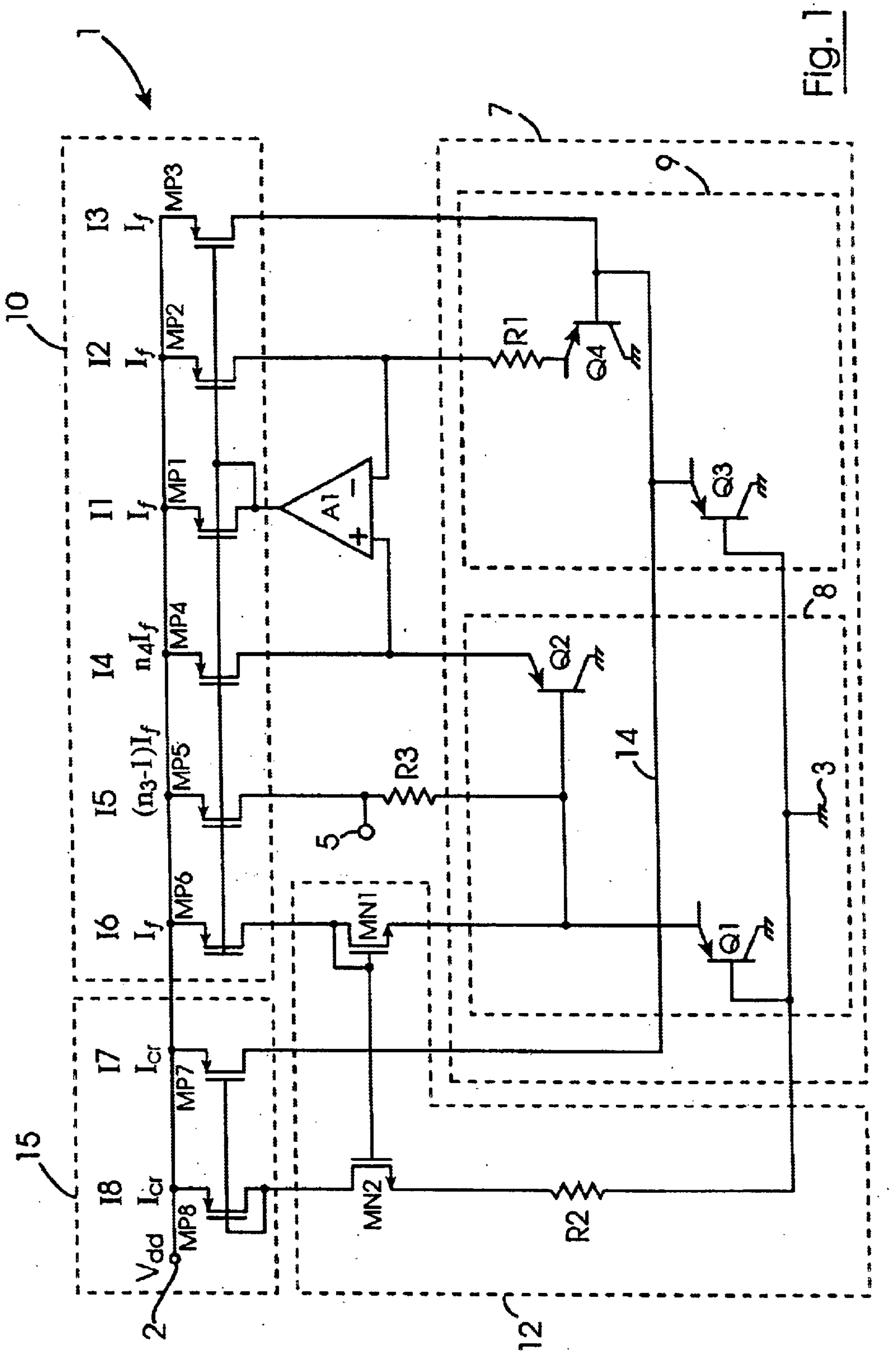
FIG. 1 is a circuit diagram of a bandgap voltage reference circuit according to the invention for producing a temperature stable, TlnT temperature curvature corrected voltage reference.

Referring to the drawings and initially to FIG. 1 there is illustrated a bandgap voltage reference circuit according to the invention indicated generally by the reference numeral 1 for providing a temperature stable DC voltage reference output with TlnT temperature curvature correction. The voltage reference circuit 1 is implemented as an integrated circuit on a silicon chip by a CMOS process. The voltage reference circuit 1 is supplied with a supply voltage $V_{dd}$ on a supply rail 2, and the voltage reference circuit 1 is grounded at 3. The temperature stable TlnT temperature curvature corrected voltage reference is developed between an output terminal 5 and ground 3.

The voltage reference circuit 1 comprises a bandgap cell 7, which comprises a first transistor stack 8 comprising two stacked transistors, namely, two first bipolar transistors Q1 and Q2, and a second transistor stack 9 comprising two stacked transistors, namely, two second bipolar transistors Q3 and Q4. The first and second transistor stacks 8 and 9 are arranged to develop a correcting PTAT voltage proportional to the difference in the base-emitter voltages $\Delta V_{be}$ of the first and second transistor stacks 8 and 9. In other words, the correcting PTAT voltage $\Delta V_{be}$ is proportional to the voltage difference in the sum of the base-emitter voltages of the first transistors Q1 and Q2, and the sum of the base-emitter voltages of the second transistors Q3 and Q4. The correcting PTAT voltage $\Delta V_{be}$ is developed across a primary resistor R1, and is scaled onto a secondary resistor R3. The scaled correcting PTAT voltage developed across the secondary resistor R3 is summed with the base-emitter CTAT voltage of the first transistor Q1 of the first transistor stack 8 for providing the voltage reference between the output terminal 5 and ground 3.

The collectors of the first and second transistors Q1, Q2, Q3 and Q4 are tied to ground. The bases of the lowermost first and second transistors in the first and second transistor stacks 8 and 9, namely, the transistors Q1 and Q3 are also tied to ground. The base of the topmost first and second transistors Q2 and Q4 in the first and second transistor stacks 8 and 9 are connected to the emitters of the corresponding first and second transistors Q1 and Q3 of the respective transistor stacks 8 and 9. The primary resistor R1 is connected between the emitter of the topmost second transistor Q4 in the second transistor stack 9 and the inverting input of a high impedance operational amplifier A1. The emitter of the topmost first transistor Q2 in the first transistor stack 8 is connected to the non-inverting input of the operational amplifier A1. The operational amplifier A1 pulls a current I1 of value $I_f$ through its output from a MOSFET mp1 of a first current mirror circuit 10 for driving the voltage on its inverting and non-inverting inputs to a common first voltage level. The current drawn by the operational amplifier A1 is substantially a PTAT current, and thus the currents supplied by the first current mirror circuit 10 are similarly substantially PTAT currents.

The emitter of the topmost second transistor Q4 of the second transistor stack 9 is supplied with a PTAT current I2 of value $I_f$ from a MOSFET mp2 of the first current mirror circuit 10 through the primary resistor R1. The emitter of the lowermost second transistor Q3 of the second transistor stack 9 is supplied with a PTAT current I3 of value $I_f$ through a MOSFET mp3 of the first current mirror circuit 10. The emitter of the topmost first transistor Q2 of the first transistor stack 8 is supplied with a PTAT current I4 of value $n_4.I_f$ by a MOSFET mp4 of the first current mirror circuit 10. The emitter of the lowermost first transistor Q1 of the first transistor stack 8 is supplied with a PTAT current I5 of value $(n_3-1).I_f$ by a MOSFET mp5 of the first current mirror circuit 10 for scaling the correcting PTAT voltage $\Delta V_{be}$ developed across the primary resistor R1 onto the secondary resistor R3. The emitter of the lowermost first transistor Q1 of the first transistor stack 8 is also supplied with a current I6 of value $I_f$ through a MOSFET mp6 of the first current mirror circuit 10 for a purpose to be described below, and thus, the sum of the currents supplied to the emitter of the lowermost first transistor Q1 is $n_3.I_f$.

The values of the PTAT currents supplied to the first and second transistors Q1, Q2, Q3 and Q4 and the emitter areas of the first and second transistors Q1, Q2, Q3 and Q4 are selected so that the current densities at which the second transistors Q3 and Q4 operate is less than the current densities at which the first transistors Q1 and Q2 operate, in order to develop the correcting PTAT voltage $\Delta V_{be}$ across the primary resistor R1. The emitter areas of the first transistors Q1 and Q2 of the first transistor stack 8 are similar, and are assumed to be each of unit area. The emitter area of the lowermost second transistor Q3 of the second transistor stack 9 is greater than the emitter area of the lowermost first transistor Q1 of the first transistor stack 8, and in this embodiment of the invention is of area $n_1$ times the emitter area of the lowermost first transistor Q1. The emitter area of the topmost second transistor Q4 of the second transistor stack 9 is greater than the emitter area of the topmost first transistor Q2 of the first transistor stack 8, and in this embodiment of the invention is of area $n_2$ times the emitter area of the topmost first transistor Q2, and is thus also of area $n_2$ times the emitter area of the lowermost first transistor Q1.

A CTAT current generating circuit 12 supplies a CTAT correcting current I7 of value $I_{cr}$ on a line 14, which is summed with the PTAT current I3 and supplied to the emitter of the lowermost second transistor Q3 of the second transistor stack 9, for providing the correcting PTAT voltage $\Delta V_{be}$ developed across the primary resistor R1 with a TlnT temperature curvature component, which is complementary to the TlnT temperature curvature component of the base-emitter CTAT voltage of the lowermost first transistor Q1, as will be explained below. The CTAT current generating circuit 12 comprises a resistor R2 across which the base-emitter CTAT voltage of the lowermost first transistor Q1 of the first transistor stack 8 is reflected through a diode connected MOSFET mn1, and a MOSFET mn2. The base-emitter CTAT voltage across the resistor R2 causes the resistor R2 to draw a CTAT current I8 of value $I_{cr}$ through a MOSFET mp8 of a second current mirror circuit 15. The current I8 drawn by the resistor R2 of value $I_{cr}$ is mirrored in the second current mirror circuit 15 by a MOSFET mp7, which supplies the CTAT correcting current I7 on the line 14 of value $I_{cr}$.

The ratio of the value $I_{cr}$ of the CTAT correcting current I7 to the value $I_f$ of the PTAT current I3 supplied to the lowermost second transistor Q3 in order to produce the TlnT temperature curvature component of the correcting PTAT voltage $\Delta V_{be}$ which is developed across the primary resistor R1 is a function of the gain factor by which the correcting PTAT voltage is reflected from the primary resistor R1 to the secondary resistor R3, and is also a function of the saturation current temperature exponent, which is referred to as σ below. The value of the saturation current temperature exponent for a diffused silicon junction is typically about four. Accordingly, for example, if the scaled correcting PTAT voltage developed across the secondary resistor R3 is scaled up by a gain factor of two from the correcting PTAT voltage developed across the primary resistor R1, and if the saturation current temperature exponent is four, then the current supplied to the emitter of the lowermost second transistor Q3 should be temperature independent. In other words, the sum of the values $I_f$, and $I_{cr}$ of the PTAT current and the CTAT correcting current, respectively, should be constant irrespective of temperature. This is achieved by setting the ratio of the value $I_{cr}$ of the CTAT correcting current to the value $I_f$ of the PTAT current supplied to the emitter of the lowermost second transistor Q3 equal to one. In other words, the value $I_{cr}$ of the CTAT correcting current should be set equal to the value $I_f$ of the PTAT current supplied to the emitter of the lowermost second transistor Q3. This can be achieved by selecting the MOSFETs mp7 and mp8 to be of appropriate areas. If, on the other hand, the saturation current temperature exponent is greater than four, then the value $I_{cr}$ of the CTAT correcting current should be greater than the value $I_f$ of the PTAT current I3 supplied to the emitter of the lowermost second transistor Q3, in order to provide the correcting PTAT voltage developed across the primary resistor R1 with the appropriate TlnT temperature curvature component. The greater the value of the saturation current temperature exponent above the value four, the greater the value $I_{cr}$ of the CTAT correcting current which will be required for a given gain factor of the correcting PTAT voltage from the primary resistor R1 to the secondary resistor R3.

The theory behind the operation of the bandgap voltage reference circuit 1 will now be described.

The known equation for the base-emitter voltage of a bipolar transistor at absolute temperature T° Kelvin is as follows:

$$V_{be}(T)=V_{G0}\left(1-\frac{T}{T_0}\right)+V_{be0}\frac{T}{T_0}-\sigma\frac{kT}{q}\ln\left(\frac{T}{T_0}\right)+\frac{kT}{q}\ln\left(\frac{I_c}{I_{c0}}\right) \quad (1)$$

where $V_{be}(T)$ is the temperature dependent base-emitter voltage for the bipolar transistor at T° Kelvin, $V_{G0}$ is the bandgap energy voltage, assumed to be about 1.205V for silicon, T is the operating absolute temperature in degrees Kelvin, $T_0$ is the reference temperature (usually the middle point of the operating temperature range) in degrees Kelvin, $V_{be0}$ is the base-emitter voltage for the bipolar transistor at the reference temperature $T_0$, k is Boltzmann's constant, q is the electron charge, σ is the saturation current temperature exponent (referred to as XTI in the SPICE TM circuit simulation programme, with a value of about 4 for diffused silicon junctions), $I_c$ is the collector current of the bipolar transistor, and $I_{c0}$ is the collector current of the bipolar transistor at reference temperature $T_0$.

The first two terms in equation (1) display a linear decrease of the base-emitter voltage as temperature is increasing. The last two terms in this equation are non-linear terms of the base-emitter voltage and are known as the uncorrected temperature curvature component of the voltage.

The first transistors Q1 and Q2, and the second transistor Q4 are biased with a PTAT current as:

$$\frac{I_c}{I_{c0}}=\frac{T}{T_0} \quad (2)$$

Accordingly, the base-emitter voltages of the first transistors Q1 and Q2, and the second transistor Q4 at temperature T° Kelvin are given by the following three equations: for the lowermost first transistor Q1, $$V_{beQ1}(T)=V_{G0}\left(1-\frac{T}{T_0}\right)+V_{beQ1}(T_0)\frac{T}{T_0}-(\sigma-1)\frac{kT}{q}\ln\left(\frac{T}{T_0}\right) \quad (3)$$

for the topmost first transistor Q2, $$V_{beQ2}(T)=V_{G0}\left(1-\frac{T}{T_0}\right)+V_{beQ2}(T_0)\frac{T}{T_0}-(\sigma-1)\frac{kT}{q'}\ln\left(\frac{T}{T_0}\right) \quad (4)$$

for the topmost second transistor Q4, $$V_{beQ4}(T)=V_{G0}\left(1-\frac{T}{T_0}\right)+V_{beQ4}(T_0)\frac{T}{T_0}-(\sigma-1)\frac{kT}{q}\ln\left(\frac{T}{T_0}\right) \quad (5)$$

The lowermost second transistor Q3 is biased with a different current, namely, the PTAT current I3 of value $I_f$ plus the CTAT current I7 of value $I_{cr}$. Accordingly, for the third transistor Q3:

$$\frac{I_c}{I_{c0}}=\left(\frac{T}{T_0}\right)^{-n} \quad (6)$$

where n is the negative temperature exponent of the emitter current of the lowermost second transistor Q3. Thus, for temperature independent constant current n=0 and for a PTAT current n−1.

Accordingly, with the lowermost second transistor Q3 biased at a current according to equation (6), the base-emitter voltage of the lowermost second transistor Q3 at temperature T° Kelvin is:

$$V_{beQ3}(T)=V_{G0}\left(1-\frac{T}{T_0}\right)+V_{beQ3}(T)_0\frac{T}{T_0}-(\sigma+n)\frac{kT}{q}*\ln\left(\frac{T}{T_0}\right) \quad (7)$$

Accordingly, the base-emitter voltages of the first and second transistors Q1 to Q4 at the reference temperature $T_0$ are: for the lowermost first transistor Q1, $$V_{beQ1}(T_0)=\frac{kT_0}{q}\ln\left(\frac{n_3 I_f(T_0)}{I_s(T_0)}\right) \quad (8)$$

for the topmost first transistor Q2, $$V_{beQ2}(T_0)=\frac{kT_0}{q}\ln\left(\frac{n_4 I_f(T_0)}{I_s(T_0)}\right) \quad (9)$$

for the topmost second transistor Q4, $$V_{beQ4}(T_0)=\frac{kT_0}{q}\ln\left(\frac{I_f(T_0)}{n_2 I_s(T_0)}\right) \quad (10)$$

for the lowermost second transistor Q3, $$V_{beQ3}(T_0)=\frac{kT_0}{q}\ln\left(\frac{I_f(T_0)+I_c(T_0)}{n_1 I_s(T_0)}\right)=\frac{kT_0}{q}\ln\left(\frac{I_{Q3e}(T_0)}{n_1 I_s(T_0)}\right) \quad (11)$$

where $I_s$ is the saturation current of the respective first and second transistors Q1 to Q4, and is proportional to the emitter area and is highly dependent on temperature and process. $I_f$ is the PTAT current generated in the first current mirror circuit and $n_3$ and $n_4$ are the scaling values for the PTAT current $I_f$ in FIG. 1, and $n_1$ and $n_2$ are the emitter areas of the second transistors Q3 and Q4, respectively relative to the emitter areas of the first transistors Q1 and Q2 as described above with reference to FIG. 1.

In equations (8), (9), (10) and (11) it can be assumed that the emitter and collector currents are the same, and that the saturation current $I_s$ is proportional to the emitter area.

Accordingly, the voltage $\Delta V_{be}$ developed across the primary resistor $R_1$ is given by the following equation:

$$\Delta V_{be}=V_{beQ1}(T)+V_{beQ2}(T)-V_{beQ3}(T)-V_{beQ4}(T) \quad (12)$$

From equations (3) to (7) and (8) to (11), equation (12) becomes:

$$\Delta V_{be} = \frac{kT}{q}\ln\left(\frac{n_3 n_4 I_f(T_0) I_f(T_0)}{I_s(T_0) I_s(T_0)}\right)\left(\frac{n_1 n_2 I_s(T_0) I_s(T_0)}{I_f(T_0) I_{Q3e}(T_0)}\right) + (n+1)\frac{kT}{q}\ln\left(\frac{T}{T_0}\right) \tag{13}$$

Equation (13) can be rewritten as:

$$\Delta V_{be} = \frac{kT}{q}\ln\left(n_1 n_2 n_3 n_4 \frac{I_f(T_0)}{I_{Q3\sigma}(T_0)}\right) + (n+1)\frac{kT}{q}\ln\left(\frac{T}{T_0}\right) \tag{14}$$

If we assume that the first transistors Q1 and Q2 each have unit emitter area then $$I_{sQ1} = I_{sQ2} = I_s$$

Because the lowermost second transistor Q3 has an emitter area of $n_1$ times larger than the emitter area of the lowermost first transistor Q1 the saturation current for the lowermost second transistor Q3 is $$I_{sQ3} = n_1 I_s$$

The saturation current for the topmost second transistor Q4 is $$I_{sQ4} = n_2 I_s$$

The collector current for the lowermost first transistor Q1 is $$I_{c1} = (n_3 - 1) I_f + I_f = n_3 I_f$$

The collector current for the topmost first transistor Q2 is $$I_{c2} = n_4 I_f$$

The lowermost second transistor Q3 has a collector current of $I_f$ (PTAT) plus the CTAT correcting current $I_{cr}$, and the CTAT correcting current $$I_{cr} = \frac{V_{bel}}{R_2},$$

where $R_2$ is the resistance of the resistor R2.

The collector current of the topmost second transistor Q4 is $I_{c4} = I_f$.

The voltage reference $V_{ref}$ developed by the bandgap voltage reference circuit 1 between the output terminal 5 and ground 3 is equal to the base-emitter voltage of the lowermost first transistor Q1 plus the voltage drop across the secondary resistor R3, which is given by the following equation:

$$V_{ref} = V_{G0}\left(1 - \frac{T}{T_0}\right) + V_{beQ1}(T_0)\frac{T}{T_0} - (\sigma - 1)\frac{kT}{q}\ln\left(\frac{T}{T_0}\right) + \frac{R_3}{R_1}(n_3 - 1)\Delta V_{be} \tag{15}$$

where $R_1$ and $R_3$ are the resistances of the primary and secondary resistors R1 and R3, respectively.

Equation (15) can be rewritten as:

$$V_{ref} = V_{G0} - A\frac{T}{T_0} + B\frac{kT}{q}\ln\left(\frac{T}{T_0}\right) \tag{16}$$

where $$A = V_{G0} - V_{beQ1}(T_0) - \frac{R_3}{R_1}(n_3 - 1)\frac{kT_0}{q}\ln\left(n_1 n_2 n_3 n_4 \frac{I_f(T_0)}{I_{Q3e}(T_0)}\right) \tag{17}$$

and $$B = -\sigma + 1 + \frac{R_3}{R_1} * (n_3 - 1) * (n + 1) \tag{18}$$

For the voltage reference $V_{ref}$ to be independent of temperature, the values of A and B must be zero. With the values of A and B equal to zero, the voltage reference $V_{ref}$ is equal to the bandgap voltage $V_{G0}$ of the lowermost first transistor Q1.

There are many options for setting the values of A and B equal to zero. One option is to force a temperature independent constant current into the emitter of the lowermost second transistor Q3. By selecting the values $I_{cr}$ and $I_f$ of the CTAT correcting current and the PTAT current, respectively, being supplied to the emitter of the second transistor Q3 to be equal to each other at room temperature, the emitter current of the second transistor Q3 is constant, and temperature independent. With the emitter current of the second transistor Q3 so selected, the equation of the emitter current of the second transistor Q3 at the reference temperature is as follows:

$$I_{Q3e}(T_0) = 2 I_f(T_0) \tag{19}$$

The value of B can be set equal to zero as follows:

Since the emitter current of the lowermost second transistor Q3 is constant, the negative temperature exponent n of the emitter current of the second transistor Q3 of equation (6) is equal to zero.

Thus, for B equal to zero and n equal to zero, equation (18) becomes:

$$\frac{R_3}{R_1}(n_3 - 1) = \sigma - 1 \tag{20}$$

The left-hand term of equation (20) represents the PTAT gain. This equation shows that the gain of the correcting PTAT voltage must be equal to the curvature voltage ($kT/q*\log(T/T_0)$) coefficient of the base-emitter voltage of the lowermost first transistor Q1.

For a diffused silicon junction σ is equal to 4, thus a PTAT gain of 3 is required. This is arranged by appropriately scaling the resistor ratio $R_3/R_1$ and the current ratio $n_3$. If the primary and secondary resistors R1 and R3, respectively, are selected to be of equal resistance values, the current ratio $n_3$ can be set equal to 4. Alternatively, the secondary resistor R3 can be selected to be of resistance value equal to twice the resistance value of the primary resistor R1, and the current ratio $n_3$ can be set equal to 5/2.

To impose the value of $\Delta V_{be}$ developed across the primary resistor $R_1$ in order to satisfy the requirement that the value of A of equation (17) is equal to zero the following is required:

If $$V_{G0} = 1.205\text{ V};\ V_{beQ1}(T_0) = 0.7\text{ V};\ \frac{kT_0}{q} = 0.026\text{ V};\ n_3 = n_4 \quad (21)$$

then from equation (17) $n_1.n_2=81$, thus $n_1=n_2=9$.

Accordingly, by selecting the values $I_{cr}$ and $I_f$ of the CTAT correcting current and the PTAT current, respectively, which is supplied to the second transistor Q3 to be equal to each other at room temperature, and by selecting the primary and secondary resistors R1 and R3 to be of resistances equal to each other, and the current ratio $n_3$ equal to 4, the current ratio $n_4$ equals the current ratio $n_3$, and the ratio of the areas $n_1$ and $n_2$ to be equal to each other and equal to 9, the voltage reference $V_{ref}$ is equal to the bandgap voltage $V_{G0}$ of the lowermost first transistor Q1, and is thus temperature independent. Alternatively, if the secondary resistor R3 is selected to be of resistance value equal to twice the resistance value of the primary resistor R1, if the current ratio $n_3$ is set equal to 5/2, and the remaining variables set as just described, the reference voltage $V_{ref}$ of the bandgap voltage reference circuit 1 is equal to the bandgap voltage $V_{G0}$ of the lowermost first transistor Q1.

An alternative option for setting the values of A and B equal to zero is to select the ratio of the CTAT correcting current to the PTAT current being supplied to the emitter of the lowermost second transistor Q3 so that the current being forced into the emitter is a predominantly CTAT current. It is known that by forcing a predominant CTAT current into the emitter of a transistor, that as the slope of the emitter current becomes negative, the base-emitter temperature curvature voltage is exaggerated. Thus, if the CTAT correcting current is sufficiently dominant in the emitter of the lowermost second transistor Q3, the base-emitter temperature curvature voltage is exaggerated at a level where the gain for the correcting PTAT voltage and the curvature voltage coefficient are equal to 2. Thus, to ensure that the value of B from equation (18) is equal to zero, equation (18) with B equal to zero can be rewritten as:

$$n = \frac{\sigma - 1}{\frac{R_3}{R_1}(n_3 - 1)} - 1 \quad (22)$$

If $n_3=n_4=3$, and the other values are according to equation (21), then the negative temperature exponent n of the emitter current of the lowermost second transistor Q3 of equation (6) is equal to 0.5. Thus, the current to be forced into the emitter of the lowermost second transistor Q3 should be halfway between a constant current and a CTAT current, and thus the following equation holds:

$$\frac{R_3}{R_1}(n_3 - 1) = \sigma - 1 \quad (23)$$

In this case, $n_1.n_2=5502$, thus, $n_1=n_2=74$.

From the above, it will be apparent that the option of forcing a constant temperature independent current into the emitter of the lowermost second transistor Q3 is the preferred option where silicon area of an integrated circuit chip is a critical factor, since the transistor area required for the second transistors Q3 and Q4 is relatively small, due to the fact that the necessary gain of the correcting PTAT voltage is mainly obtained from the ratio of the resistance of the secondary resistance R3 to the resistance of the primary resistor R1, and the current ratio $n_3$. The option of forcing a predominantly CTAT correcting current into the emitter of the lowermost second transistor Q3 would be the preferred option where the silicon area available for the second transistors Q3 and Q4 is not critical. The latter option of forcing a predominantly CTAT correcting current into the emitter of the lowermost second transistor Q3 is less sensitive to offsets of the operational amplifier A1 and the first and second current mirror circuits.

Figure 2:
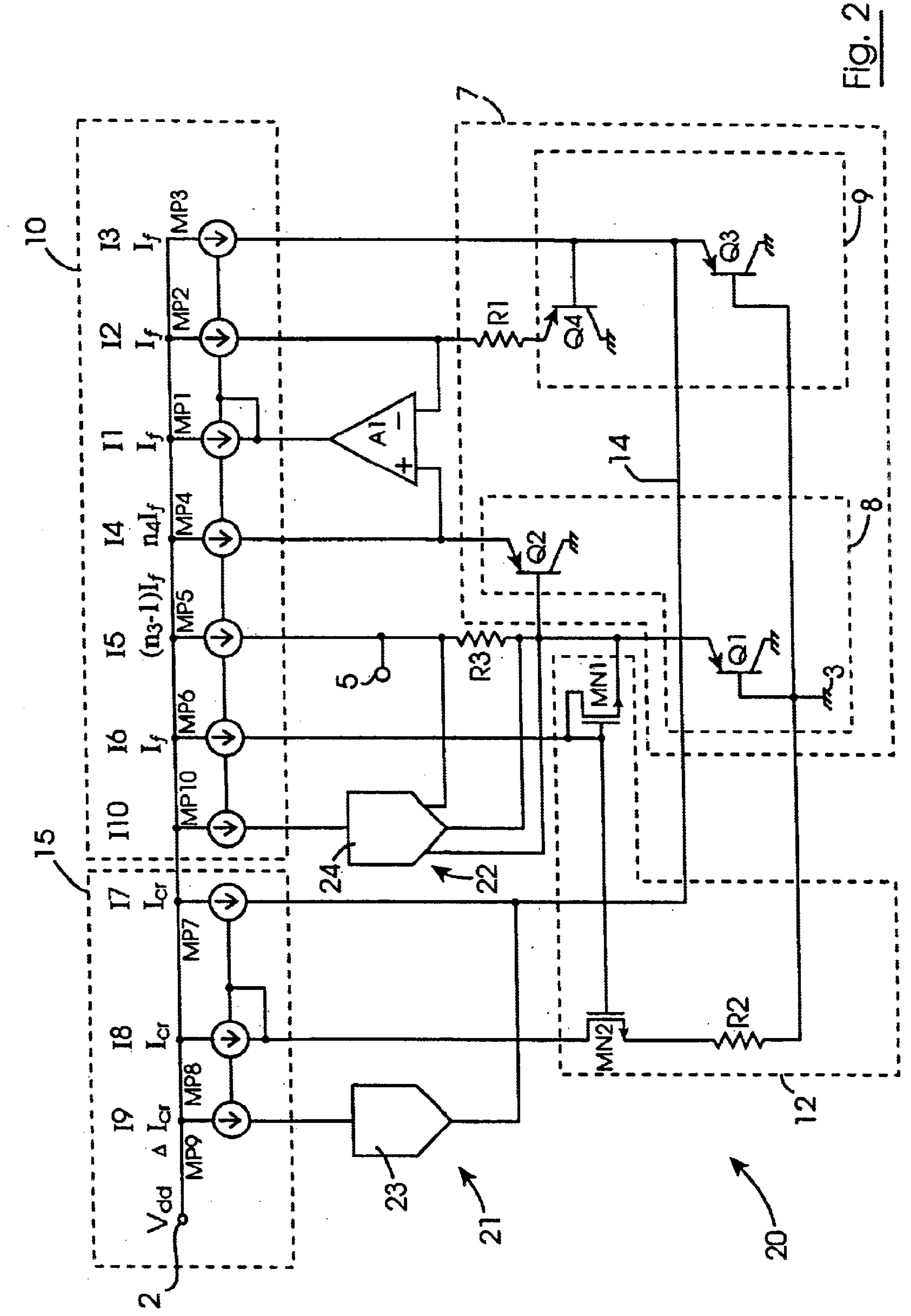
FIG. 2 is a circuit diagram of a bandgap voltage reference circuit according to another embodiment of the invention for producing a temperature stable, TlnT temperature curvature corrected voltage reference.

Referring now to FIG. 2, there is illustrated a band gap voltage reference circuit, indicated generally by the reference numeral 20, for producing a temperature stable TlnT curvature corrected DC voltage reference. The bandgap voltage reference circuit 20 is substantially similar to the bandgap voltage reference circuit 1, and similar components are identified by the same reference numerals. The main difference between the voltage reference circuit 20 and the voltage reference circuit 1 is that first and second calibrating circuits 21 and 22 are provided for calibrating the voltage reference circuit 20. The first calibration circuit 21 is provided for calibrating the CTAT correcting current I7 which is fed on the line 14 to the emitter of the lowermost second transistor Q3 for fine tuning the value $I_{cr}$ of the CTAT correcting current I7. The first calibration circuit 21 comprises a first programmable current digital to analogue converter (DAC) 23 which outputs a CTAT calibration current $\Delta I_{cr}$ which is summed with the CTAT correcting current I7 being fed to the emitter of the lowermost second transistor Q3 on the line 14. The CTAT calibration current $\Delta I_{cr}$ is derived from a CTAT current I9 which is derived from the second current mirror circuit 15 through a MOSFET mp9. The value of the CTAT calibration current $\Delta I_{cr}$ is selectable by appropriately programming the first current DAC 23.

The second calibration circuit 22 comprises a second programmable current DAC 24 which is fed with a PTAT current I10 derived from the first current mirror circuit 10 through a MOSFET mp10. The second DAC 24 provides relatively coarse adjustment of the scaled correcting PTAT voltage developed across the secondary resistor R3 and fine adjustment of the base-emitter CTAT voltage of the lowermost first transistor Q1. The second DAC 24 sources and sinks a calibration current ΔIpc through the secondary resistor R3 for adjusting the correcting PTAT voltage developed across the secondary resistor R3. The value of the calibration current ΔIpc and its direction is selectable by appropriately programming the second DAC 24, thereby permitting upward and downward adjustment of the correcting PTAT voltage developed across the secondary resistor R3. By virtue of the fact that the second DAC 24 sources and sinks the calibration current ΔIpc the calibration current ΔIpc has no effect on the emitter current of the lowermost first transistor Q1. The second DAC 24 is also programmable to provide a calibration current ΔIpf for feeding to the lowermost first transistor Q1 for fine tuning the base-emitter CTAT voltage of the lowermost first transistor Q1.

A non-volatile memory (not shown) is provided for programming the first and second DACs 23 and 24 during final test and packaging.

Figure 4:
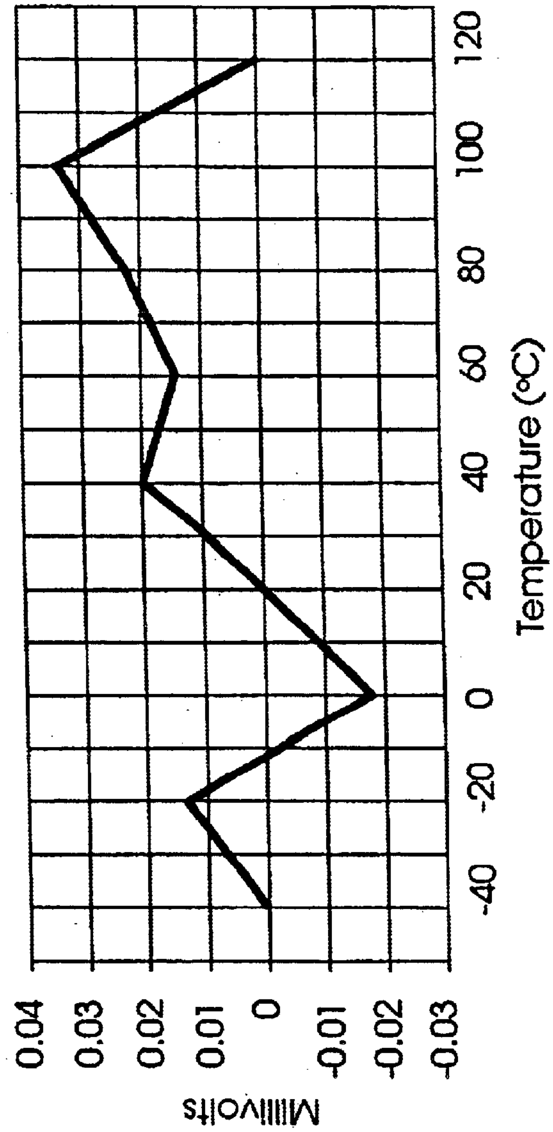
FIG. 4 illustrates a waveform resulting from tests carried out on a CMOS implementation of the circuit of FIG. 2.
Figure 3:
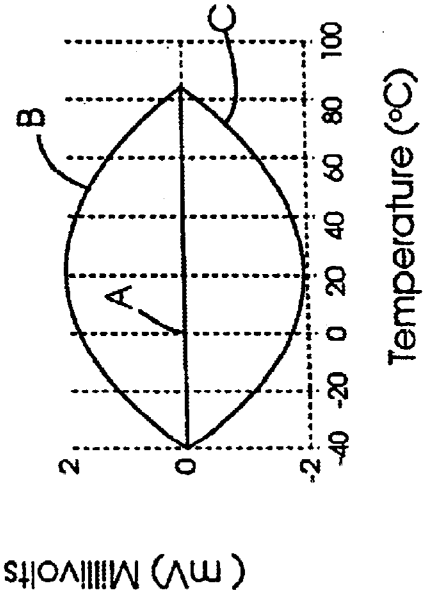
FIG. 3 illustrates waveforms resulting from tests carried out on a simulation of the bandgap voltage reference circuit of FIG. 2.

Referring now to FIGS. 3 and 4, FIG. 3 illustrates the results of simulated tests which have been carried out on a computer simulation of the bandgap voltage reference circuit 20 of FIG. 2, while FIG. 4 illustrates the results of tests which have been carried out on a CMOS implementation of the bandgap voltage reference circuit 20 of FIG. 2. FIG. 3 illustrates three waveforms of voltages in millivolts of the bandgap voltage reference circuit 20 plotted against temperature over a temperature range of −42° C. to +85° C. The waveform A illustrates the voltage reference $V_{ref}$ developed across the output terminal 5 and ground 3, and as can be seen, is substantially constant over the entire temperature range of −42° C. to +85° C. The waveform B illustrates the uncorrected base-emitter CTAT voltage of the lowermost first transistor Q1, while the waveform C illustrates the scaled correcting PTAT voltage which is developed across the secondary resistor R3. As can be seen, the correcting PTAT voltage developed across the secondary resistor R3 has a TlnT temperature curvature which is complementary to the TlnT temperature curvature of the uncorrected base-emitter CTAT voltage of the lowermost first transistor Q1.

FIG. 4 illustrates a plot of the deviation of the reference voltage $V_{ref}$ of the bandgap voltage reference circuit 20 from a straight line constant voltage on an enlarged scale over a temperature range of −40° C. to +120° C. The voltage is plotted in millivolts against the temperature in degrees centigrade. As can be seen, the maximum positive deviation from a straight line constant voltage occurs at 100° C. and is no more than 0.034 millivolts, while the maximum negative deviation occurs at 0° C. and is only 0.018 millivolts.

Thus, it can be seen that the voltage reference $V_{ref}$ outputted between the output terminal 5 and ground 3 remains substantially constant and is substantially temperature independent over a wide temperature range of −40° C. to +120° C.

Figure 5:
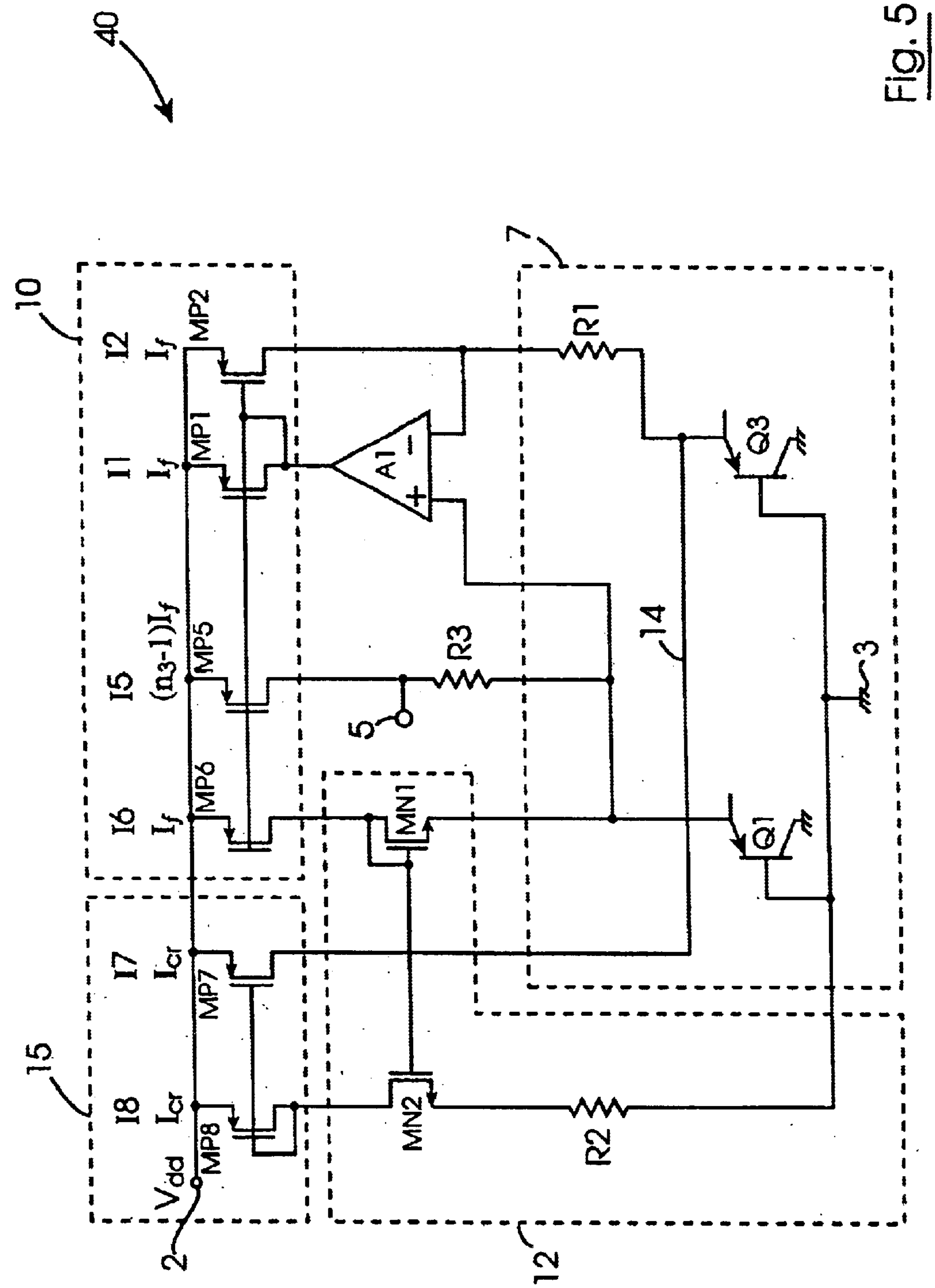
FIG. 5 is a circuit diagram of a bandgap voltage reference circuit according to another embodiment of the invention for producing a temperature stable, TlnT temperature curvature corrected voltage reference.

Referring now to FIG. 5, there is illustrated a bandgap voltage reference circuit according to another embodiment of the invention, indicated generally by the reference numeral 40. The bandgap voltage reference circuit 40 is substantially similar to the bandgap voltage reference circuit of FIG. 1, and similar components are identified by the same reference numerals. The main difference between the bandgap voltage reference circuit 40 and the circuit 1 is that instead of the bandgap cell 7 comprising first and second stacks of first and second transistors for developing the difference voltage $\Delta V_{be}$ across the primary resistor R1, the bandgap cell 7 comprises only one first bipolar transistor Q1, and only one second bipolar transistor Q3. The emitter area of the second transistor Q3 is $n_1$ times the emitter area of the first transistor Q1, as has already been described with reference to the bandgap voltage reference circuit of FIG. 1. The emitter of the second transistor Q3 is supplied with the PTAT current I2 of value $I_f$ through the primary resistor R1. The CTAT correcting current $I_{cr}$ is supplied to the emitter of the second transistor Q3 on the line 14. The first transistor Q1 is supplied with the PTAT current I5 of value $(n_3-1)I_f$ through the secondary resistor R3. The voltage reference is developed between the terminal 5 and ground 3. Since the transistors Q2 and Q4 have been omitted from the bandgap voltage reference circuit 40, the PTAT currents 13 and 14 are not required, and thus the MOSFETs mp3 and mp4 have been omitted from the first current mirror circuit 10.

Otherwise, the bandgap voltage reference circuit 40 of FIG. 5 is similar to that of FIG. 1, and the PTAT difference voltage $\Delta V_{be}$ developed across the primary resistor R1 is proportional to the difference in the base-emitter voltages of the first and second transistors Q1 and Q3, and is scaled onto the secondary resistor R3.

While the bandgap voltage reference circuit described with reference to FIG. 1 has been described as comprising first and second transistor stacks each comprising two transistors, it is envisaged that the first and second transistor stacks may comprise more than two transistors, however, the number of transistors in each transistor stack should be similar.

It will also be appreciated that each transistor in the respective first and second transistor stacks may be provided by a plurality of transistors in order to obtain the necessary emitter areas. For example, the first transistors could each be provided of unit emitter area as respective single transistors, while the corresponding transistors in the second transistor stack may each be provided as a number of transistors each of unit emitter area in order to sum to the appropriate emitter area.

While the PTAT and CTAT currents have been described as being derived from current mirror circuits, any other suitable means for providing such PTAT and CTAT currents may be used without departing from the scope of the invention.

It will also be appreciated that other means for developing the first voltage level besides an operational amplifier may be used.

It is envisaged that in certain cases the primary resistor may be provided in a location in the second transistor stack other than being connected between the emitter of the topmost second transistor of the second transistor stack and the inverting input of the operational amplifier. For example, it is envisaged in certain cases that the primary resistor may be located between any two of the stacked second transistors.

While the CTAT correcting current has been described as being supplied to the emitter of the lowermost second transistor of the second transistor stack, it will be appreciated that it is not necessary for the CTAT correcting current to be supplied to the lowermost second transistor, the CTAT correcting current may be supplied to the emitter of any one of the second transistors of the second transistor stack. Indeed, in certain cases, it is envisaged that a CTAT correcting current may be supplied to the emitters of more than one of the second transistors of the second transistor stack.

While the correcting PTAT voltage with the complementary TlnT temperature curvature correction developed across the primary resistor R1 has been described as being reflected onto the secondary resistor R3, it will be readily apparent to those skilled in the art that in certain cases it may not be necessary to scale the correcting PTAT voltage from the primary resistor to the secondary resistor. The value of the correcting PTAT voltage developed across the secondary resistor may be the same as that developed across the primary resistor. It will also be appreciated that the correcting PTAT voltage with the complementary TlnT temperature curvature correction may be combined with an uncorrected transistor base-emitter CTAT voltage of any transistor besides one of the transistors in the first transistor stack. For example, the correcting PTAT voltage with the complementary TlnT temperature curvature correction could be combined with an uncorrected base-emitter CTAT voltage of a transistor externally of the bandgap cell. In which case, it is envisaged that the secondary resistor would be arranged to facilitate summing of the correcting PTAT voltage with the TlnT temperature curvature correction with the uncorrected base-emitter CTAT voltage of such a transistor.

While the first and second transistors of the first and second transistor stacks have been described as having their collectors held at a common voltage level, in certain cases, it is envisaged that this may not be necessary, however, by holding the collectors of the first and second transistors of the first and second transistor stacks at the common voltage level, the bandgap voltage reference circuit according to the invention is particularly suited to fabrication in a CMOS process.

What is claimed is:

1. A bandgap voltage reference circuit for providing a temperature stable voltage reference with TlnT temperature curvature correction, the bandgap voltage reference circuit comprising at least one first transistor and at least one second transistor supplied with respective PTAT currents, the at least one second transistor being operable at a current density lower than the current density at which the at least one first transistor is operable, and co-operating with the at least one first transistor for developing a correcting PTAT voltage proportional to the difference in the base-emitter voltages of the first and second transistors for combining with an uncorrected transistor base-emitter CTAT voltage for producing the voltage reference, wherein a CTAT correcting current is supplied to one of the at least one second transistors along with the PTAT current for developing the correcting PTAT voltage with a curvature complementary to the TlnT temperature curvature of the uncorrected transistor base-emitter CTAT voltage, so that when the correcting PTAT voltage is combined with the uncorrected transistor base-emitter CTAT voltage, the voltage reference produced is temperature stable and TlnT temperature curvature corrected.

2. A bandgap voltage reference circuit as claimed in claim 1 in which the ratio of the CTAT correcting current to the PTAT current is selected in response to the ratio of the area of the at least one second transistor to the area of the at least one first transistor.

3. A bandgap voltage reference circuit as claimed in claim 1 in which a primary resistor is provided co-operating with the first and second transistors so that the correcting PTAT voltage corresponding to the difference in the base-emitter voltages of the first and second transistors is developed across the primary resistor.

4. A bandgap voltage reference circuit as claimed in claim 3 in which the at least one first transistor is connected between a first voltage level and a second voltage level, the second voltage level being different to the first voltage level, and the at least one second transistor is connected in series with the primary resistor between the first voltage level and the second voltage level.

5. A bandgap voltage reference circuit as claimed in claim 3 in which the PTAT current which is supplied to the second transistor to which the primary resistor is connected is supplied through the primary resistor to the second transistor.

6. A bandgap voltage reference circuit as claimed in claim 4 in which the collectors of the first and second transistors are held at a common voltage level, and the PTAT currents are supplied to the emitters of the first and second transistors, the CTAT correcting current being supplied to the emitter of the second transistor.

7. A bandgap voltage reference circuit as claimed in claim 6 in which the common voltage level is the same as the second voltage level.

8. A bandgap voltage reference circuit as claimed in claim 6 in which the primary resistor is connected between the first voltage level and the emitter of one of the at least one second transistors.

9. A bandgap voltage reference circuit as claimed in claim 3 in which a secondary resistor is provided, and the correcting PTAT voltage is reflected from the primary resistor across the secondary resistor, the secondary resistor co-operating with the transistor, the uncorrected base-emitter CTAT voltage of which is to be combined with the correcting PTAT voltage for summing the correcting PTAT voltage with the uncorrected base-emitter CTAT voltage of the transistor for producing the voltage reference.

10. A bandgap voltage reference circuit as claimed in claim 9 in which the correcting PTAT voltage is scaled from the primary resistor to the secondary resistor.

11. A bandgap voltage reference circuit as claimed in claim 1 in which the transistor the uncorrected base-emitter CTAT voltage of which is to be combined with the PTAT correcting voltage is one of the at least one first transistor.

12. A bandgap voltage reference circuit as claimed in claim 9 in which the CTAT correcting current is selected in response to the gain of the correcting PTAT voltage from the primary resistor to the secondary resistor.

13. A bandgap voltage reference circuit as claimed in claim 4 in which the circuit comprises one first transistor and one second transistor, the bases of the first and second transistors being held at the second voltage level.

14. A bandgap voltage reference circuit as claimed in claim 4 in which a plurality of first transistors are provided arranged in a first transistor stack, so that the base-emitter voltages of the first transistors are summed to provide a base-emitter voltage of the first stack, and a plurality of second transistors are arranged in a second transistor stack so that the sum of the base-emitter voltages of the second transistors are summed to provide a base-emitter voltage of the second stack, the number of second transistors in the second stack corresponding to the number of first transistors in the first stack, the first and second transistors being supplied with respective PTAT currents.

15. A bandgap voltage reference circuit as claimed in claim 14 in which the base of each first transistor is connected to the emitter of the next lower first transistor in the first transistor stack, and the base of each second transistor is connected to the emitter of the next lower second transistor in the second transistor stack.

16. A bandgap voltage reference circuit as claimed in claim 14 in which the primary resistor is connected between the topmost second transistor in the second transistor stack and the first voltage level.

17. A bandgap voltage reference circuit as claimed in claim 14 in which the CTAT correcting current is supplied to the lowermost second transistor of the second transistor stack.

18. A bandgap voltage reference circuit as claimed in claim 14 in which the bases of the lowermost first and second transistors of the respective first and second transistor stacks are connected to the second voltage level.

19. A bandgap voltage reference circuit as claimed in claim 14 in which the transistor the uncorrected base-emitter CTAT voltage of which is to be combined with the correcting PTAT voltage is the lowermost first transistor of the first transistor stack.

20. A bandgap voltage reference circuit as claimed in claim 1 in which the CTAT correcting current is derived from the uncorrected base-emitter CTAT voltage of the transistor with which the correcting PTAT voltage is combined.

21. A bandgap voltage reference circuit as claimed in claim 1 in which a first calibration circuit is provided for adjusting the CTAT correcting current.

22. A bandgap voltage reference circuit as claimed in claim 9 in which a second calibration circuit is provided for adjusting the PTAT current supplied through the secondary resistor for adjusting the correcting PTAT voltage developed across the secondary resistor.

23. A bandgap voltage reference circuit as claimed in claim 22 in which the second calibration circuit provides for adjusting the PTAT current supplied to the transistor, the uncorrected base-emitter CTAT voltage of which is to be combined with the correcting PTAT voltage.

24. A bandgap voltage reference circuit as claimed in claim 1 in which the circuit is implemented in CMOS.

25. A PTAT voltage generating circuit for generating a PTAT voltage with a curvature complementary to an uncorrected TlnT temperature curvature of a base-emitter CTAT voltage of a transistor, the PTAT voltage generating circuit comprising at least one first transistor and at least one second transistor supplied with respective PTAT currents, the at least one second transistor being operable at a current density lower than the current density at which the at least one first transistor is operable, and co-operating with the at least one first transistor for developing a PTAT voltage proportional to the difference in the base-emitter voltages of the first and second transistors, wherein a CTAT correcting current is supplied to one of the at least one second transistors along with the PTAT current for developing the PTAT voltage with the curvature complementary to the TlnT temperature curvature of an uncorrected transistor base-emitter CTAT voltage.

26. A PTAT voltage generating circuit as claimed in claim 25 in which the ratio of the CTAT current to the PTAT current is selected in response to the ratio of the area of the at least one second transistor to the area of the at least one first transistor.

27. A PTAT voltage generating circuit as claimed in claim 25 in which a primary resistor is provided co-operating with the first and second transistors so that the PTAT voltage corresponding to the difference in the base-emitter voltages of the first and second transistors is developed across the primary resistor.

28. A PTAT voltage generating circuit as claimed in claim 27 in which the at least one first transistor is connected between a first voltage level and a second voltage level, the second voltage level being different to the first voltage level, and the at least one second transistor is connected in series with the primary resistor between the first voltage level and the second voltage level.

29. A PTAT voltage generating circuit as claimed in claim 27 in which the PTAT current which is supplied to the second transistor to which the primary resistor is connected is supplied through the primary resistor to the second transistor.

30. A PTAT voltage generating circuit as claimed in claim 28 in which the collectors of the first and second transistors are held at a common voltage level, and the PTAT currents are supplied to the emitters of the first and second transistors, the CTAT correcting current being supplied to the emitter of the second transistor.

31. A PTAT voltage generating circuit as claimed in claim 30 in which the common voltage level is the same as the second voltage level.

32. A PTAT voltage generating circuit as claimed in claim 28 in which a plurality of first transistors are provided arranged in a first transistor stack, the base of each first transistor being connected to the emitter of the next lower first transistor in the first transistor stack, so that the base-emitter voltages of the first transistors are summed to provide a base-emitter voltage of the first stack, and a plurality of second transistors arranged in a second transistor stack, the base of each second transistor being connected to the emitter of the next lower second transistor in the second transistor stack, so that the sum of the base-emitter voltages of the second transistors are summed to provide a base-emitter voltage of the second stack, the number of second transistors in the second stack corresponding to the number of first transistors in the first stack, the first and second transistors being supplied with respective PTAT currents.

33. A PTAT voltage generating circuit as claimed in claim 32 in which the primary resistor is connected between the topmost second transistor in the second transistor stack and the first voltage level, and the CTAT correcting current is supplied to the lowermost second transistor of the second transistor stack, the bases of the lowermost first and second transistors of the respective first and second transistor stacks being connected to the second voltage level.

34. A method for generating a temperature stable bandgap voltage reference with TlnT temperature curvature correction, the method comprising the steps of:

providing at least one first transistor and at least one second transistor co-operating with the at least one first transistor for developing a correcting PTAT voltage proportional to the difference in the base-emitter voltages of the first and second transistors, supplying the at least one first transistor and the at least one second transistor with respective PTAT currents, operating the at least one second transistor at a current density lower than the current density at which the at least one first transistor is being operated for developing the correcting PTAT voltage, and combining the correcting PTAT voltage with an uncorrected transistor base-emitter CTAT voltage for producing the voltage reference, wherein the method comprises the further step of supplying a CTAT correcting current to one of the at least one second transistors along with the PTAT current for developing the correcting PTAT voltage with a curvature complementary to the TlnT temperature curvature of the uncorrected transistor base-emitter CTAT voltage, so that when the correcting PTAT voltage is combined with the uncorrected transistor base-emitter CTAT voltage, the voltage reference produced is temperature stable and TlnT temperature curvature corrected.

35. A method as claimed in claim 34 in which the PTAT currents are supplied to the emitters of the first and second transistors and the CTAT correcting current is supplied to the emitter of the second transistor.

36. A method as claimed in claim 34 in which the ratio of the CTAT correcting current to the PTAT current is selected in response to the ratio of the area of the at least one first transistor to the area of the at least one second transistor.

37. A method for generating a PTAT voltage with a curvature complementary to an uncorrected TlnT temperature curvature of a base-emitter CTAT voltage of a transistor, the method comprising the steps of:

providing at least one first transistor and at least one second transistor co-operating with the at least one first transistor for developing a PTAT voltage proportional to the difference in the base-emitter voltages of the first and second transistors, supplying the at least one first transistor and the at least one second transistor with respective PTAT currents, and operating the at least one second transistor at a current density lower than the current density at which the at least one first transistor is being operated for developing the PTAT voltage proportional to the difference in the base-emitter voltages of the first and second transistors, wherein the method comprises the further step of supplying a CTAT correcting current to one of the at least one second transistors along with the PTAT current for developing the PTAT voltage with a curvature complementary to the TlnT temperature curvature of an uncorrected transistor base-emitter CTAT voltage.

38. A method as claimed in claim 37 in which the PTAT currents are supplied to the emitters of the first and second transistors, and the CTAT correcting current is supplied to the emitter of the second transistor.

39. A method as claimed in claim 37 in which the ratio of the CTAT correcting current to the PTAT current is selected in response to the ratio of the area of the at least one first transistor to the area of the at least one second transistor.

* * * * *